US012777687B2

(12) United States Patent

Liu et al.

(10) Patent No.: US 12,777,687 B2
(45) Date of Patent: Oct. 27, 2026

(54) METHOD OF MANUFACTURING A SEMICONDUCTOR DEVICE INCLUDING PATTERNING A SEMICONDUCTOR SUBSTRATE TO FORM OPENINGS

(71) Applicant: Taiwan Semiconductor Manufacturing Co., Ltd., Hsinchu (TW)

(72) Inventors: Fu Wei Liu, Tainan (TW); Pei-Wei Lee, Kaohsiung City (TW); Yun-Chung Wu, Taipei City (TW); Bo-Yu Chiu, Taoyuan City (TW); Szu-Hsien Lee, Tainan City (TW); Mirng-Ji Lii, Sinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 635 days.

(21) Appl. No.: 18/149,935

(22) Filed: Jan. 4, 2023

(65) Prior Publication Data

US 2024/0128231 A1 Apr. 18, 2024

Related U.S. Application Data

(60) Provisional application No. 63/416,178, filed on Oct. 14, 2022.

(51) Int. Cl.
*H10D 62/00* (2026.01)
*H10W 72/00* (2026.01)
(Continued)

(52) U.S. Cl.
CPC ............ *H10D 62/00* (2025.01); *H10W 90/00* (2026.01); *H10W 72/07331* (2026.01); *H10W 72/353* (2026.01)

(58) Field of Classification Search
CPC ..... H01L 25/00; H01L 25/0657; H01L 25/50; H01L 2224/83896; H01L 25/83;
(Continued)

(56) References Cited

U.S. PATENT DOCUMENTS 9,327,964 B2 * 5/2016 Allegato ............. B81C 1/00238
9,695,039 B1 * 7/2017 Liu ....................... B81B 3/0051
(Continued)

*Primary Examiner* — Khiem D Nguyen
(74) *Attorney, Agent, or Firm* — Slater Matsil, LLP

(57) ABSTRACT

Semiconductor devices and methods of manufacturing the semiconductor devices are presented. In embodiments the methods of manufacturing include depositing a first bonding layer on a first substrate, wherein the first substrate comprises a semiconductor substrate and a metallization layer. The first bonding layer and the semiconductor substrate are patterned to form first openings. A second substrate is bonded to the first substrate. After the bonding the second substrate, the second substrate is patterned to form second openings, at least one of the second openings exposing at least one of the first openings. After the patterning the second substrate, a third substrate is bonded to the second substrate, and after the bonding the third substrate, the third substrate is patterned to form third openings, at least one of the third openings exposing at least one of the second openings.

20 Claims, 6 Drawing Sheets

(51) Int. Cl.
*H10W 72/30* (2026.01)
*H10W 90/00* (2026.01)

(58) Field of Classification Search
CPC .......... H01L 2224/29186; H01L 24/28; H10D 62/00; H10W 80/00; H10W 90/00; H10W 72/073; H10W 72/30; H10W 72/07331; H10W 72/353; H10W 72/90
See application file for complete search history.

(56) References Cited

U.S. PATENT DOCUMENTS

| | | | | |
|---|---|---|---|---|
| 11,049,844 | B2 * | 6/2021 | Bonam | H01L 25/00 |
| 2015/0137283 | A1 * | 5/2015 | Liang | B81B 7/02<br>438/51 |
| 2015/0348905 | A1 * | 12/2015 | Tsai | H10W 90/00<br>257/774 |
| 2020/0357765 | A1 * | 11/2020 | Wu | H01L 24/24 |

* cited by examiner

METHOD OF MANUFACTURING A SEMICONDUCTOR DEVICE INCLUDING PATTERNING A SEMICONDUCTOR SUBSTRATE TO FORM OPENINGS

PRIORITY CLAIM AND CROSS-REFERENCE

This application claims the benefit of U.S. Provisional Application No. 63/416,178, filed on Oct. 14, 2022, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to help reduce the physical size of a semiconductor device. In a stacked semiconductor device, active circuits such as logic, memory, processor circuits, MEMS, optical devices, and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
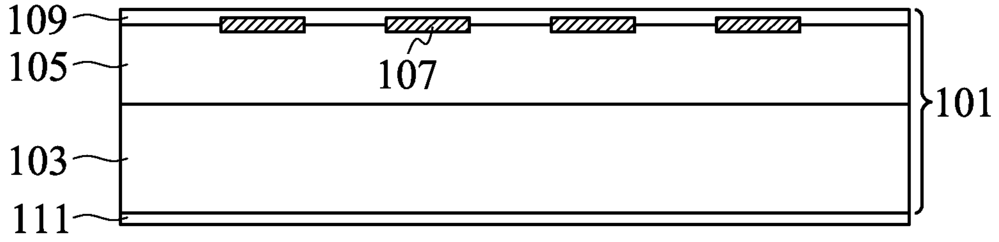
FIG. 1 illustrates a first substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which bond multiple substrates together and use etching processes to form trench arrays in each of the different substrates so that the trench arrays are homogeneous in size and depth. However, the embodiments described herein are intended to be illustrative and are not intended to be limiting. Rather, the ideas described may be implemented in a wide variety of embodiments, and all such embodiments are fully intended to be included within the scope of the embodiments.

With reference now to FIG. 1, there is illustrated a first substrate 101 with a first bonding layer 111 on the first substrate 101. In an embodiment the first substrate 101 may be a semiconductor die and comprises a semiconductor substrate 103 that is part of a semiconductor wafer (not fully shown as a remainder of the semiconductor wafer extends away from the structure illustrated in FIG. 1). In other embodiments the first substrate 101 may be separated from a semiconductor wafer, such as already being formed and singulated. Any suitable embodiment may be utilized.

In an embodiment the semiconductor dies may be photonic dies (with, e.g., optical receiving components), microelectromechanical systems (MEMS) dies, logic dies, memory dies, sensor dies, I/O dies, central processing unit (CPU) dies, graphic dies, ASIC dies, converter dies, flash dies, power dies, interposers, combinations of these, or the like. However, any suitable functionalities of the semiconductor dies may be utilized.

In an embodiment the first substrate 101 may comprise a semiconductor substrate 103, optional active devices (not separately illustrated), metallization layers 105, contact pads 107, and a passivation layer 109. The semiconductor substrate 103 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the semiconductor substrate 103 at this point in the process may be part of a semiconductor wafer (the full wafer of which is not illustrated in FIG. 1) that will be singulated in a later step.

The first substrate 101 may additionally comprise active devices (not separately illustrated) and passive devices in order to provide a desired functionality to the first substrate 101. However, as one of skill in the art will recognize, a wide variety of active devices such as capacitors, resistors, inductors and the like may be used to generate the desired structural and functional requirements of the design for the first substrate 101. The active devices may be formed using any suitable methods either within or else on the surface of the semiconductor substrate 103.

The metallization layers 105 are formed over the semiconductor substrate 103 and the active devices and are designed to connect the various active devices to form functional circuitry. The metallization layers 105 are formed of alternating layers of dielectric and conductive material and may be formed through any suitable process (such as deposition, damascene, dual damascene, etc.). In an embodiment there may be thirteen layers of metallization separated from the semiconductor substrate 103, but the precise number of metallization layers 105 is dependent upon the design of the first substrate 101.

The contact pads 107 may be formed over and in electrical contact with the metallization layers 105. The contact pads 107 may comprise aluminum, but other materials, such as copper, may also be used. The contact pads 107 may be formed using a deposition process, such as sputtering, to form a layer of material (not separately illustrated) and portions of the layer of material may then be removed through a suitable process (such as photolithographic masking and etching) to form the contact pads 107. However, any other suitable process may be utilized. The contact pads 107 may be formed to have a thickness of between about 0.5 μm and about 4 μm, such as about 1.45 μm. However, any suitable thickness may be used.

The passivation layer 109 may be formed over the metallization layers 105. The passivation layer 109 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 109 may be formed through a process such as chemical vapor deposition (CVD), although any suitable process may be utilized, and may have a thickness between about 0.5 μm and about 5 μm, such as about 9.25 KÅ.

FIG. 1 additionally illustrates formation of a first bonding layer 111 on an opposite side of the semiconductor substrate 103 from the passivation layer 109. In an embodiment the first bonding layer 111 may be used for fusion bonding (also referred to as oxide-to-oxide bonding—discussed further below with respect to FIG. 3), hybrid bonding, combinations of these, or the like. In accordance with some embodiments, the first bonding layer 111 is formed of a silicon-containing dielectric material such as silicon oxide, silicon nitride, or the like. The first bonding layer 111 may be deposited or otherwise formed using any suitable method, such as, atomic layer deposition (ALD), chemical vapor deposition (CVD), high-density plasma chemical vapor deposition (HDPCVD), physical vapor deposition (PVD), oxidation, nitridation, combinations of these, or the like to a thickness of between about 500 nm and about 1000 nm. However, any suitable material, process, and thickness may be utilized.

Figure 2:
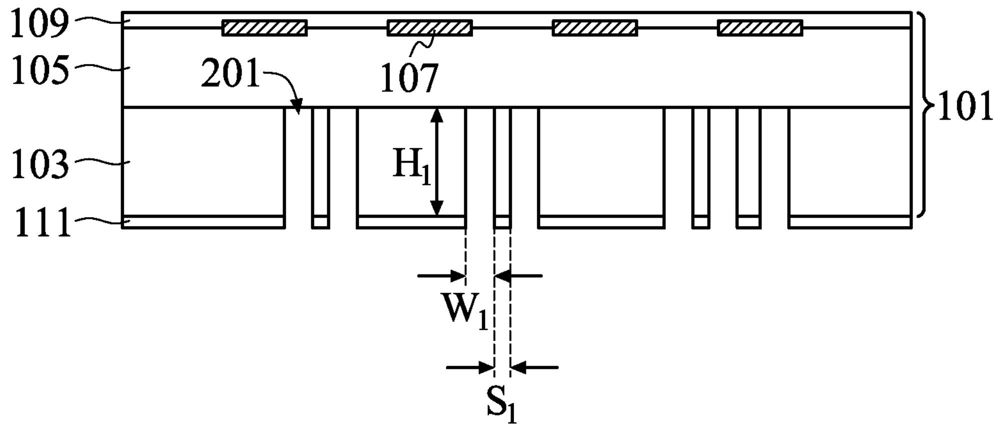
FIG. 2 illustrates a patterning of the first substrate, in accordance with some embodiments.

FIG. 2 illustrates a patterning of the semiconductor substrate 103 within the first substrate 101 to form first trenches 201 (or first openings). In an embodiment the patterning may be performed using, e.g., a photolithographic masking and etching process, whereby a photosensitive material is deposited, exposed to a patterned energy source (e.g., light), and developed to form a mask. Once the mask is ready, an anisotropic etch such as a reactive ion etch is utilized to transfer the pattern of the mask to the underlying semiconductor substrate 103. However, any suitable method may be utilized to pattern the semiconductor substrate 103.

In an embodiment the dimensions of the first trenches 201 are at least in part determined by the desired functionality of the first substrate 101. For example, in an embodiment in which the first substrate 101 is an optical device, the first trenches 201 may be utilized in order to allow for passage of optical signals to receivers (not separately illustrated) formed within the first substrate 101. In such an embodiment the first trenches 201 may be formed to have a first height $H_1$ of between about 10 μm and about 50 μm and may be formed to have a first width $W_1$ of between about 5 μm and about 50 μm. Further, the first trenches 201 may be spaced apart from each other by a first spacing $S_1$ of between about 10 μm and about 20 μm. However, any suitable functionality and any suitable dimensions may be utilized.

In another embodiment in which the first substrate 101 is a MEMS die, the first trenches 201 may be utilized to release movable portions of the first substrate 101. In this embodiment the first trenches 201 may be formed to have a first height $H_1$ of between about 10 μm and about 50 μm and may be formed to have a first width $W_1$ of between about 5 μm and about 50 μm. Further, the first trenches 201 may be spaced apart from each other by a first spacing $S_1$ of between about 10 μm and about 20 μm. However, any suitable functionality and any suitable dimensions may be utilized.

Finally, while only seven of the first trenches 201 are illustrated in FIG. 2, this is intended to be illustrative and is not intended to be limiting, as the precise number of first trenches 201 is dependent at least in part on the desired design of the first substrate 101. In some particular embodiments the number of first trenches 201 may be greater than 100. Any suitable number of first trenches 201 may be formed, and all suitable numbers are fully intended to be included within the scope of the embodiments.

Figure 3:
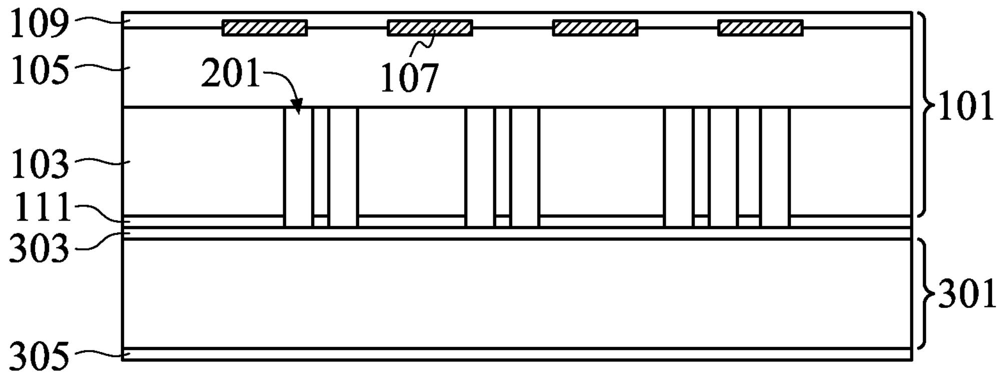
FIG. 3 illustrates a bonding of a second substrate to the first substrate, in accordance with some embodiments.

FIG. 3 illustrates that, once the first trenches 201 have been formed, a second substrate 301 may be bonded to the first substrate 101 through the first bonding layer 111. In an embodiment the second substrate 301 may be similar to the first substrate 101 such as by being a semiconductor wafer with semiconductor dies at least partially formed therein, with similar functionalities (e.g., MEMS dies, photonic dies, logic dies, memory dies, etc.). Any suitable functionality may be utilized.

However, in other embodiments, the second substrate 301 may not provide an electrical functionality but may serve as, e.g., a support substrate. In such an embodiment the second substrate 301 may comprise a single material throughout the second substrate 301, such as silicon carbide, silicon oxide, silicon, combinations of these, or the like. In other embodiments in which the second substrate 301 is a support substrate the second substrate 301 may comprise multiple layers of different materials to provide the desired support. Any suitable materials and any suitable number of layers may be used.

To prepare the second substrate 301 for bonding, a second bonding layer 303 may be formed on a first side of the second substrate 301. In an embodiment the second bonding layer 303 may be used for fusion bonding (also referred to as oxide-to-oxide bonding) the second substrate 301 to the first substrate 101. In accordance with some embodiments, the second bonding layer 303 is formed of a silicon-containing dielectric material such as silicon oxide, silicon nitride, or the like. The second bonding layer 303 may be deposited or otherwise formed using any suitable method, such as, atomic layer deposition (ALD), chemical vapor deposition (CVD), high-density plasma chemical vapor deposition (HDPCVD), physical vapor deposition (PVD), oxidation, nitridation, or the like to a thickness of between about 500 nm and about 1000 nm. However, any suitable material, process, and thickness may be utilized.

To begin the process of bonding the first bonding layer 111 to the second bonding layer 303, the surfaces of the first bonding layer 111 and the surfaces of the second bonding layer 303 may initially be activated. Activating the top surfaces of the first bonding layer 111 and the second bonding layer 303 may comprise a dry treatment, a wet treatment, a plasma treatment, exposure to an inert gas plasma, exposure to $H_2$, exposure to $N_2$, exposure to $O_2$, combinations thereof, or the like, as examples. In embodiments where a wet treatment is used, an RCA cleaning may be used, for example. In another embodiment, the activation process may comprise other types of treatments. The activation process assists in the hybrid bonding of the first bonding layer 111 and the second bonding layer 303.

After the activation process, the first bonding layer 111 and the second bonding layer 303 may be placed into physical contact. In an embodiment the first bonding layer 111 is placed into physical contact with the second bonding layer 303 using, e.g., an alignment process in order to minimize overlay differences during the placement process. With the activation process chemically modifying the surfaces, the bonding process between the materials is begun upon the physical contact.

Once physical contact has begun the bonding process, the bonding may then be strengthened by subjecting the assembly to a thermal treatment. In an embodiment the first bonding layer 111 and the second bonding layer 303 may be subjected to a temperature between about 200° C. and about 400° C. to strengthen the bond. In this manner, fusion of the first bonding layer 111 and the second bonding layer 303 forms a bonded device.

Additionally, while specific processes have been described to initiate and strengthen the bonds between the first bonding layer 111 and the second bonding layer 303, these descriptions are intended to be illustrative and are not intended to be limiting upon the embodiments. Rather, any suitable combination of baking, annealing, pressing, or combination of processes may be utilized. All such processes are fully intended to be included within the scope of the embodiments.

Also, while fusion bonding (e.g., oxide bonding) has been described as one method of bonding the first substrate 101 and the second substrate 301, this as well is only intended to be illustrative and is not intended to be limiting upon the embodiments. Rather, any suitable method of bonding, such as hybrid bonding, copper-to-copper bonding, or the like, may also be utilized. Any suitable method of bonding the first substrate 101 and the second substrate 301 may be utilized, and all such methods are fully intended to be included within the scope of the embodiments.

FIG. 3 additionally illustrates formation of a third bonding layer 305 on a side of the second substrate 301 opposite the second bonding layer 303. In an embodiment the third bonding layer 305 may be used for fusion bonding. In accordance with some embodiments, the third bonding layer 305 is formed of a silicon-containing dielectric material such as silicon oxide, silicon nitride, or the like. The third bonding layer 305 may be deposited or otherwise formed using any suitable method, such as, atomic layer deposition (ALD), chemical vapor deposition (CVD), high-density plasma chemical vapor deposition (HDPCVD), physical vapor deposition (PVD), oxidation, nitridation, or the like to a thickness of between about 500 nm and about 1000 nm. However, any suitable material, process, and thickness may be utilized.

Additionally, while the formation of the third bonding layer 305 has been described as being performed after the bonding of the second substrate 301 to the first substrate 101, this is intended to be illustrative and is not intended to be limiting. Rather, the third bonding layer 305 may be formed prior to the bonding of the second substrate 301 to the first substrate 101 and may be performed either simultaneously with or sequentially with the formation of the second bonding layer 303. Any suitable sequence of steps may be utilized, and all such sequences are fully intended to be included within the scope of the embodiments.

Figure 4:
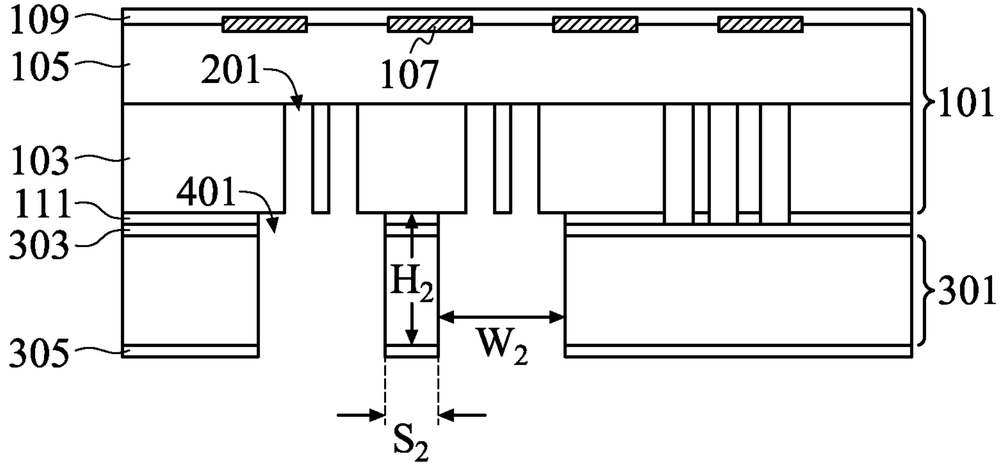
FIG. 4 illustrates a patterning of the second substrate, in accordance with some embodiments.

FIG. 4 illustrates a patterning of the second substrate 301 to form second trenches 401. In an embodiment the patterning may be performed using, e.g., a photolithographic masking and etching process, whereby a photosensitive material is deposited, exposed to a patterned energy source (e.g., light), and developed to form a mask. Once the mask is ready, one or more anisotropic etching processes such as one or more reactive ion etches are utilized to transfer the pattern of the mask to the underlying second substrate 301. However, any suitable method may be utilized to pattern the second substrate 301.

In a particular embodiment a first etching process is utilized to etch the material of the third bonding layer 305. Once the third bonding layer 305 has been patterned, a second etching process is utilized to extend the second trenches 401 through the material of the second substrate 301, where the second bonding layer 303 may be used as an etch stop layer during the patterning of the second substrate 301. Once the second substrate 301 has been patterned, a third etching process is utilized to extend the second trenches 401 through the material of the second bonding layer 303, where the first bonding layer 111 may be used as an etch stop layer during the patterning of the second bonding layer 303.

Finally, the second trenches 401 are extended through the first bonding layer 111. In an embodiment in which the first bonding layer 111 is a same material as the second bonding layer 303, the etching process used to etch through the second bonding layer 303 may simply be continued to etch through the first bonding layer 111. In other embodiments in which the material of the first bonding layer 111 is a different material as the second bonding layer 303, or else in which a different process is desired, a separate etching process or separate etching parameters may be used to extend the second trenches 401 through the first bonding layer 111. In such embodiments, the second trenches 401 will have straight sidewalls, and sidewalls of the first bonding layer 111 are aligned with sidewalls of the second bonding layer 303.

In an embodiment the dimensions of the second trenches 401 are at least in part determined by the desired functionality of the second substrate 301. For example, in an embodiment in which the second substrate 301 is a support substrate of a material such as silicon carbide, the second trenches 401 may be formed to have a second height $H_2$ (including, e.g., the second substrate 301, the first bonding layer 111, and the second bonding layer 303) of between about 20 μm and about 50 μm. Further, the second trenches 401 may be spaced apart from each other by a second spacing $S_2$ of between about 20 μm and about 40 μm. However, any suitable functionality and any suitable dimensions may be utilized.

Additionally, the second trenches 401 may be formed to have a second width $W_2$ that is greater than the first width $W_1$ of the first trenches 201. In further embodiments the second width $W_2$ of the second trenches 401 may be formed to expose multiple ones of the first trenches 201. As such, the second width $W_2$ may be between about 10 μm and about 100 μm. However, any suitable width may be utilized.

Finally, while only three of the second trenches 401 are illustrated in FIG. 4, this is intended to be illustrative and is not intended to be limiting, as the precise number of second trenches 401 is dependent at least in part on the desired design of the second substrate 301. In some particular embodiments the number of second trenches 401 may be less than the number of first trenches 201, and may be greater than 50. Any suitable number of second trenches 401 may be formed, and all suitable numbers are fully intended to be included within the scope of the embodiments.

By forming the first trenches 201 prior to the bonding of the second substrate 301 to the first substrate 101, and then by forming the second trenches 401 after the bonding, the problems associated with multi-step etching after the bonding process (e.g., problems associated with poor control of the trench depths and openings) can be avoided. In particular, by etching the first substrate 101 prior to bonding and etching the second substrate 301 after the bonding, the plasma etching can be more selective to the substrates and bonding medias used and, because the substrates are separately thinned down prior to bonding, there is a low deviation in thickness between trenches located within each substrate. Given all of this, an overlay shift between the first trenches 201 and the second trenches 401 may be reduced to be less than about 1 μm.

Figure 5:
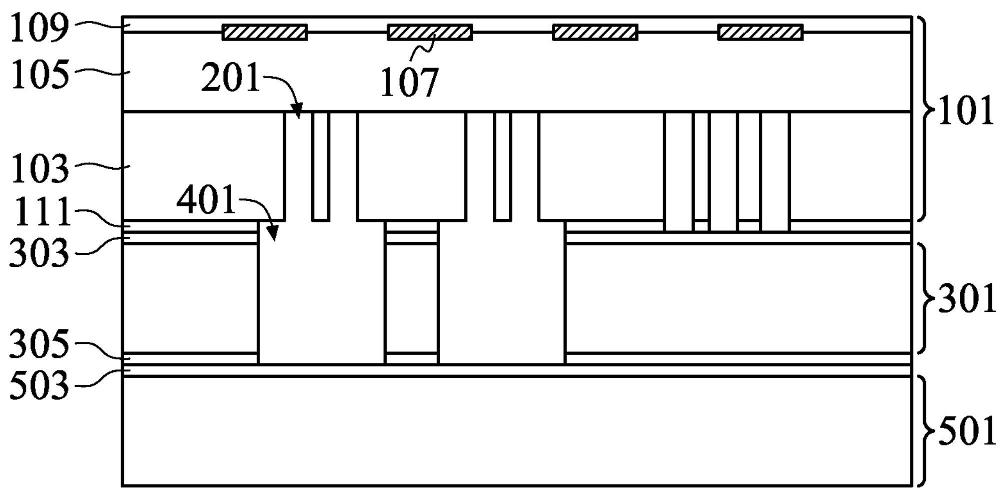
FIG. 5 illustrates a bonding of a third substrate to the second substrate, in accordance with some embodiments.

FIG. 5 illustrates that, once the second trenches 401 have been formed, a third substrate 501 may be bonded to the second substrate 301 through the third bonding layer 305. In an embodiment the third substrate 501 may be similar to the first substrate 101 and the second substrate 301 such as by being a semiconductor wafer with semiconductor dies at least partially formed therein, with similar functionalities (e.g., MEMS dies, photonic dies, logic dies, memory dies, etc.).

However, in other embodiments, the third substrate 501 may not provide an electrical functionality but may serve as, e.g., a support substrate. In such an embodiment the third substrate 501 may comprise a single material throughout the third substrate 501, such as silicon carbide, silicon oxide, silicon, combinations of these, or the like. In other embodiments in which the third substrate 501 is a support substrate the third substrate 501 may comprise multiple layers of different materials to provide the desired support. Any suitable materials and any suitable number of layers may be used.

To prepare the third substrate 501 for bonding, a fourth bonding layer 503 may be formed on a first side of the third substrate 501. In an embodiment the fourth bonding layer 503 may be used for fusion bonding. In accordance with some embodiments, the fourth bonding layer 503 is formed of a silicon-containing dielectric material such as silicon oxide, silicon nitride, or the like. The fourth bonding layer 503 may be deposited or otherwise formed using any suitable method, such as, atomic layer deposition (ALD), chemical vapor deposition (CVD), high-density plasma chemical vapor deposition (HDPCVD), physical vapor deposition (PVD), oxidation, nitridation, or the like to a thickness of between about 500 nm and about 1000 nm. However, any suitable material, process, and thickness may be utilized.

Once the fourth bonding layer 503 has been deposited or formed, the third substrate 501 may be bonded to the second substrate 301. In an embodiment the bonding process may be started by initially activating surfaces of the third bonding layer 305 and the surfaces of the fourth bonding layer 503. Activating the top surfaces of the third bonding layer 305 and the fourth bonding layer 503 may comprise a dry treatment, a wet treatment, a plasma treatment, exposure to an inert gas plasma, exposure to $H_2$, exposure to $N_2$, exposure to $O_2$, combinations thereof, or the like, as examples. In embodiments where a wet treatment is used, an RCA cleaning may be used, for example. In another embodiment, the activation process may comprise other types of treatments. The activation process assists in the hybrid bonding of the third bonding layer 305 and the fourth bonding layer 503.

After the activation process, the third bonding layer 305 and the fourth bonding layer 503 may be placed into physical contact. In an embodiment the third bonding layer 305 is placed into physical contact with the fourth bonding layer 503 using, e.g., an alignment process in order to minimize overlay differences during the placement process. With the activation process chemically modifying the surfaces, the bonding process between the materials is begun upon the physical contact.

Once physical contact has begun the bonding process, the bonding may then be strengthened by subjecting the assembly to a thermal treatment. In an embodiment the third bonding layer 305 and the fourth bonding layer 503 may be subjected to a temperature between about 200° C. and about 400° C. to strengthen the bond. In this manner, fusion of the third bonding layer 305 and the fourth bonding layer 503 forms a bonded device.

Additionally, while specific processes have been described to initiate and strengthen the bonds between the third bonding layer 305 and the fourth bonding layer 503, these descriptions are intended to be illustrative and are not intended to be limiting upon the embodiments. Rather, any suitable combination of baking, annealing, pressing, or combination of processes may be utilized. All such processes are fully intended to be included within the scope of the embodiments.

Also, while fusion bonding has been described as one method of bonding the third bonding layer 305 and the fourth bonding layer 503, this as well is only intended to be illustrative and is not intended to be limiting upon the embodiments. Rather, any suitable method of bonding, such as hybrid bonding, copper-to-copper bonding, or the like, may also be utilized. Any suitable method of bonding the third bonding layer 305 and the fourth bonding layer 503 may be utilized.

Figure 6:
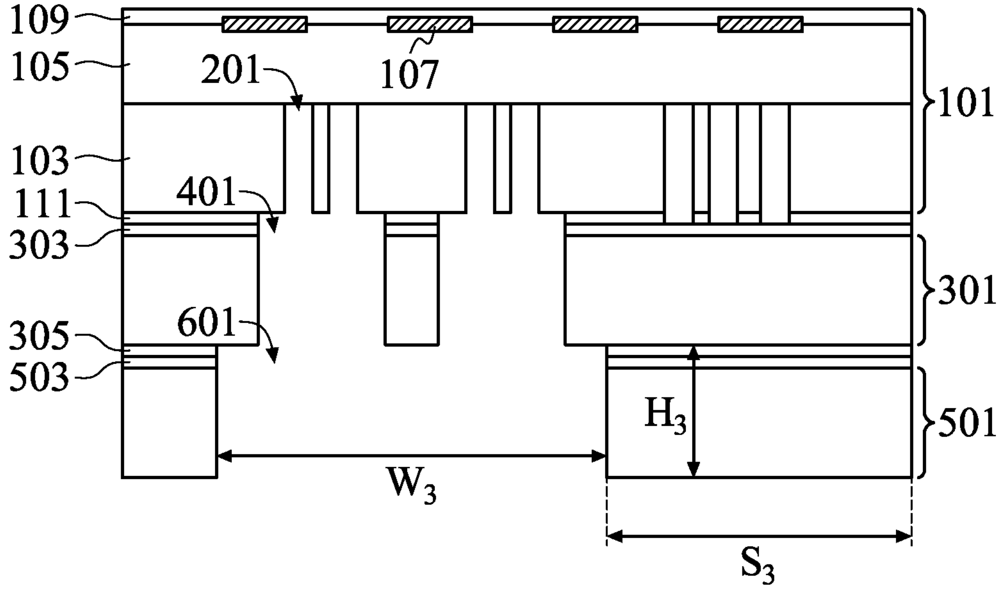
FIG. 6 illustrates a patterning of the third substrate, in accordance with some embodiments.

FIG. 6 illustrates a patterning of the third substrate 501 to form third trenches 601. In an embodiment the patterning may be performed using, e.g., a photolithographic masking and etching process, whereby a photosensitive material is deposited, exposed to a patterned energy source (e.g., light), and developed to form a mask. Once the mask is ready, one or more anisotropic etch processes such as one or more reactive ion etches are utilized to transfer the pattern of the mask to the underlying third substrate 501. However, any suitable method may be utilized to pattern the third substrate 501.

In a particular embodiment a first etching process is utilized to etch the material of the third substrate 501, where the fourth bonding layer 503 is used as an etch stop layer during the etching of the third substrate 501. Once the third substrate 501 has been patterned, a second etching process is utilized to extend the third trenches 601 through the material of the fourth bonding layer 503, where the third bonding layer 305 may be used as an etch stop layer during the patterning of the fourth bonding layer 503. However, any suitable method or number of steps may be utilized to form the third trenches 601.

Finally, the third trenches 601 are extended through the third bonding layer 305. In an embodiment in which the third bonding layer 305 is a same material as the fourth bonding layer 503, the etching process used to etch through the fourth bonding layer 503 may simply be continued to etch through the third bonding layer 305. In other embodiments in which the material of the fourth bonding layer 503 is a different material as the third bonding layer 305, or else in which a different process is otherwise desired, a separate etching process or separate etching parameters may be used to extend the third trenches 601 through the third bonding layer 305. In such embodiments, the third trenches 601 will have straight sidewalls, and sidewalls of the third bonding layer 305 are aligned with sidewalls of the fourth bonding layer 503.

In an embodiment the dimensions of the third trenches 601 are at least in part determined by the desired functionality of the third substrate 501. For example, in an embodiment in which the third substrate 501 is a support substrate of a material such as silicon carbide, the third trenches 601 may be formed to have a third height $H_3$ (including, e.g., the third substrate 501, the third bonding layer 305, and the fourth bonding layer 503) of between about 40 μm and about 50 μm. Further, the third openings 601 may be spaced apart from each other by a third spacing $S_3$ of between about 40 μm and about 80 μm. However, any suitable functionality and any suitable dimensions may be utilized.

Additionally, the third trenches 601 may be formed to have a third width $W_3$ that is greater than the second width $W_2$ of the second trenches 401. In further embodiments the third width $W_3$ of the third trenches 601 may be formed to expose multiple ones of the second trenches 401. As such, the third width $W_3$ may be between about 20 μm and about 200 μm. However, any suitable width may be utilized.

Finally, while only one of the third trenches 601 are illustrated in FIG. 6, this is intended to be illustrative and is not intended to be limiting, as the precise number of third trenches 601 is dependent at least in part on the desired design of the third substrate 501. In some particular embodiments the number of third trenches 601 may be less than the number of second trenches 401, and may be greater than 25. Any suitable number of third trenches 601 may be formed, and all suitable numbers are fully intended to be included within the scope of the embodiments.

Once the third trenches 601 have been formed, additional processing may be performed, if desired. For example, the contact pads 107 may be exposed and further electrical connections may be made to the contact pads 107, or the first trenches 201, the second trenches 401, and the third trenches 601 may be filled or else left unfilled. Further, if the first substrate 101 is still part of a semiconductor wafer, the first substrate 101 may be singulated from the semiconductor wafer, and the first substrate 101 may be bonded to other devices.

Additionally, while two bonding processes have been described herein to illustrate the various embodiments, this is intended to be illustrative of the processes, and is not intended to be limiting. Rather, if desired, the above described processes may be repeated so that any desired number of substrates (e.g., three substrate, four substrate, five substrate, etc.) may be added and patterned. Any suitable number of substrates may be utilized to form the desired device.

By bonding the first substrate 101, the second substrate 301, and the third substrate 501 and patterned these substrates as described in the previous description, previous issues related to the uniformity of the trench depth and opening widths can be mitigated or even eliminated. In particular, by following the above processes trench arrays can be formed using, e.g., anisotropic etch processes to obtain trenches with homogeneous sizes and depths in each of the first substrate 101, the second substrate 301, and the third substrate 501. Further, an overlay shift between the first trenches 201 and the second trenches 401 may be reduced to be less than about 1 μm, and an overlay shift between the second trenches 401 and the third trenches 601 may be reduced to be less than about 1 μm.

In accordance with an embodiment, a method of manufacturing a semiconductor device includes: depositing a first bonding layer on a first substrate, the first substrate comprising a semiconductor substrate and a metallization layer; patterning the first bonding layer and the semiconductor substrate to form first openings; bonding a second substrate to the first substrate; after the bonding the second substrate, patterning the second substrate to form second openings, at least one of the second openings exposing at least one of the first openings; after the patterning the second substrate, bonding a third substrate to the second substrate; and after the bonding the third substrate, patterning the third substrate to form third openings, at least one of the third openings exposing at least one of the second openings. In an embodiment the first openings have a first width and the second openings have a second width larger than the first width. In an embodiment the third openings have a third width larger than the second width. In an embodiment a first one of the first openings is separated from a second one of the first openings by a first distance and wherein a first one of the second openings is separated from a second one of the second openings by a second distance larger than the first distance. In an embodiment a first one of the third openings is separated from a second one of the third openings by a third distance larger than the second distance. In an embodiment the bonding the second substrate to the first substrate is performed at least in part with a fusion bonding process. In an embodiment the first openings and the second openings remain unfilled during the bonding the third substrate.

In accordance with another embodiment, a method of manufacturing a semiconductor device includes: fusion bonding a first substrate to a second substrate; forming second trenches through the second substrate to expose first trenches in the first substrate, the first trenches extending through a semiconductor portion of the first substrate; fusion bonding a third substrate to the second substrate; and forming third trenches through the third substrate to expose the second trenches. In an embodiment the method further includes: forming a first bonding layer on the first substrate; and patterning the first bonding layer and the first substrate to form the first trenches. In an embodiment the fusion bonding the first substrate to the second substrate further includes: forming a second bonding layer on the second substrate; and placing the second bonding layer in physical contact with the first bonding layer. In an embodiment the method further includes forming a third bonding layer on an opposite side of the second substrate from the second bonding layer. In an embodiment the forming the third bonding layer is in place during the forming the third trenches. In an embodiment the fusion bonding the third substrate to the second substrate further includes: forming a fourth bonding layer on the third substrate; and placing the fourth bonding layer in physical contact with the third bonding layer. In an embodiment the first substrate includes: the semiconductor portion; active devices located at least partially within the semiconductor portion; metallization layers located over the active devices; and a passivation layer located over the metallization layers.

In accordance with yet another embodiment, a semiconductor device includes: a first substrate including: a semiconductor substrate; a metallization layer over the semiconductor substrate; a passivation layer over the metallization layer; and first trenches extending through the semiconductor substrate; a second substrate bonded to the first substrate with a first bonding layer and a second bonding layer, the first bonding layer and the second bonding layer being located between the first substrate and the second substrate; second trenches extending through the second substrate, the first bonding layer, and the second bonding layer, the second trenches exposing multiple ones of the first trenches; a third substrate bonded to the second substrate with a third bonding layer and a fourth bonding layer, the third bonding layer and the fourth bonding layer being located between the second substrate and the third substrate; and third trenches extending through the third substrate, the third bonding layer, and the fourth bonding layer, the third trenches exposing multiple ones of the second trenches. In an embodiment the second substrate is silicon carbide. In an embodiment the first trenches have a first width and the second trenches have a second width larger than the first width. In an embodiment the third trenches have a third width larger than the second width. In an embodiment the second trenches have straight sidewalls. In an embodiment the third trenches have straight sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
- depositing a first bonding layer on a first substrate, the first substrate comprising a semiconductor substrate and a metallization layer;
- patterning the first bonding layer and the semiconductor substrate to form first openings;
- bonding a second substrate to the first substrate;
- after the bonding the second substrate, patterning the second substrate to form second openings, at least one of the second openings exposing at least one of the first openings;
- after the patterning the second substrate, bonding a third substrate to the second substrate; and
- after the bonding the third substrate, patterning the third substrate to form third openings, at least one of the third openings exposing at least one of the second openings.

2. The method of claim 1, wherein one of the first openings has a first width and a corresponding one of the second openings has a second width larger than the first width.

3. The method of claim 2, wherein a corresponding one of the third openings has a third width larger than the second width.

4. The method of claim 1, wherein a first one of the first openings is separated from a second one of the first openings by a first distance and wherein a first one of the second openings is separated from a second one of the second openings by a second distance larger than the first distance.

5. The method of claim 4, wherein a first one of the third openings is separated from a second one of the third openings by a third distance larger than the second distance.

6. The method of claim 1, wherein the bonding the second substrate to the first substrate is performed at least in part with a fusion bonding process.

7. The method of claim 1, wherein the first openings and the second openings remain unfilled during the bonding the third substrate.

8. A method of manufacturing a semiconductor device, the method comprising:
- fusion bonding a first substrate to a second substrate;
- forming first trenches in the first substrate;
- forming second trenches through the second substrate to expose the first trenches in the first substrate, wherein the first trenches extend through a semiconductor portion of the first substrate;
- fusion bonding a third substrate to the second substrate; and
- forming third trenches through the third substrate to expose the second trenches.

9. The method of claim 8, further comprising:
- forming a first bonding layer on the first substrate; and
- patterning the first bonding layer and the first substrate to form the first trenches.

10. The method of claim 9, wherein the fusion bonding the first substrate to the second substrate further comprises:
- forming a second bonding layer on the second substrate; and
- placing the second bonding layer in physical contact with the first bonding layer.

11. The method of claim 10, further comprising forming a third bonding layer on an opposite side of the second substrate from the second bonding layer.

12. The method of claim 11, wherein the forming the third bonding layer is in place during the forming the third trenches.

13. The method of claim 12, wherein the fusion bonding the third substrate to the second substrate further comprises:
- forming a fourth bonding layer on the third substrate; and
- placing the fourth bonding layer in physical contact with the third bonding layer.

14. The method of claim 8, wherein the first substrate comprises:
- the semiconductor portion;
- active devices located at least partially within the semiconductor portion;
- metallization layers located over the active devices; and
- a passivation layer located over the metallization layers.

15. A method of manufacturing a semiconductor device, the method comprising:
- receiving a first substrate, the first substrate comprising:
  - a semiconductor substrate;
  - a metallization layer over the semiconductor substrate;
  - a passivation layer over the metallization layer; and first trenches extending through the semiconductor substrate;

bonding a second substrate to the first substrate with a first bonding layer and a second bonding layer, the first bonding layer and the second bonding layer being located between the first substrate and the second substrate;

forming second trenches extending through the second substrate, the first bonding layer, and the second bonding layer, the second trenches exposing multiple ones of the first trenches;

bonding a third substrate to the second substrate with a third bonding layer and a fourth bonding layer, the third bonding layer and the fourth bonding layer being located between the second substrate and the third substrate; and forming third trenches extending through the third substrate, the third bonding layer, and the fourth bonding layer, the third trenches exposing multiple ones of the second trenches.

16. The method of claim 15, wherein the second substrate comprises silicon carbide.

17. The method of claim 15, wherein one of the first trenches has a first width and a corresponding one of the second trenches has a second width larger than the first width.

18. The method of claim 17, wherein a corresponding one of the third trenches has a third width larger than the second width.

19. The method of claim 15, wherein the second trenches have straight sidewalls.

20. The method of claim 19, wherein the third trenches have straight sidewalls.

* * * * *